United States Patent
Marholev

(10) Patent No.: US 7,266,351 B2
(45) Date of Patent: *Sep. 4, 2007

(54) TRANSCONDUCTANCE / C COMPLEX BAND-PASS FILTER

(75) Inventor: Bojko F. Marholev, Marina del Rey, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/348,893

(22) Filed: Feb. 7, 2006

(65) Prior Publication Data

US 2006/0128342 A1 Jun. 15, 2006

Related U.S. Application Data

(63) Continuation-in-part of application No. 10/244,102, filed on Sep. 13, 2002, now abandoned, and a continuation-in-part of application No. 10/345,494, filed on Jan. 16, 2003, now Pat. No. 7,002,403.

(51) Int. Cl.
*H04B 1/10* (2006.01)
*H04B 1/16* (2006.01)

(52) U.S. Cl. .................. 455/130; 455/213; 455/307; 455/339; 327/552

(58) Field of Classification Search ............ 455/241.1, 455/253.2, 213, 320–307, 339, 341; 327/552–559
See application file for complete search history.

(56) References Cited

U.S. PATENT DOCUMENTS

| | | | | |
|---|---|---|---|---|
| 6,122,496 A | * | 9/2000 | Yoshioka | 455/307 |
| 6,181,197 B1 | * | 1/2001 | Bret et al. | 327/557 |
| 6,184,747 B1 | * | 2/2001 | Helgeson et al. | 327/552 |
| 6,285,865 B1 | * | 9/2001 | Vorenkamp et al. | 455/307 |
| 6,549,074 B2 | * | 4/2003 | Ugajin et al. | 330/258 |
| 7,002,403 B2 | * | 2/2006 | Marholev | 327/552 |
| 2002/0163384 A1 | * | 11/2002 | Hasegawa | 330/258 |
| 2003/0006834 A1 | * | 1/2003 | Morie et al. | 327/552 |
| 2003/0045263 A1 | * | 3/2003 | Wakayama et al. | 455/323 |
| 2003/0080786 A1 | * | 5/2003 | Hughes | 327/103 |

\* cited by examiner

*Primary Examiner*—Simon Nguyen
(74) *Attorney, Agent, or Firm*—Garlick Harrison & Markison; James A. Harrison

(57) ABSTRACT

A complex filter such as the channel select filter in a radio transceiver is implemented using a transconductance/C topology to benefit from the ability to tune such filters and thereby stabilize the output transfer function of the filter over variations in temperature, power supply voltage and process. The topology is based on an active R/C biquadratic topology to achieve the additional benefit of independently controlled stages. The problem created by the R in the output impedance is can be overcome by separately tuning the R value along with the transconductance/C ratio, by implementing the R as a transconductance amplifier having common mode feedback, or by implementing the transconductance amplifiers of the topology using Nauta transconductors, and unbalancing the common mode circuit of the Nauta transconductor to achieve a differential resistance that can be used to implement the R in the output impedance.

24 Claims, 13 Drawing Sheets

TRANSCONDUCTANCE / C COMPLEX BAND-PASS FILTER

CROSS REFERENCE TO RELATED APPLICATIONS

This application is a continuation-in-part and incorporates by reference U.S. Utility Application Ser. No. 10/244,102, filed on Sep. 13, 2002 now abandoned, said filed application having the same named inventor as the present application and is a continuation of U.S. Utility Application Ser. No. 10/345,494, filed on Jan. 16, 2003 now U.S. Pat. No. 7,002,403.

BACKGROUND

1. Field of the Invention

This invention relates to complex filters, and more particularly to a complex filter topology that is based on a biquadratic topology but provides a tunable filter characteristic that is a function of transconductance and capacitance.

2. Description of the Related Art

Communication systems are known to support wireless and wire lined communications between wireless and/or wire lined communication devices. Such communication systems range from national and/or international cellular telephone systems to the Internet to point-to-point in-home wireless networks. Each type of communication system is constructed, and hence operates, in accordance with one or more communication standards. For instance, wireless communication systems may operate in accordance with one or more standards including, but not limited to IEEE 802.11, Bluetooth, advanced mobile phone services (AMPS), digital amps, global system for mobile communications (GSM), code division multiple access (CDMA), local multi-point distribution systems (LMDS), multi-channel-multi-point distribution systems (MMDS), and/or variations thereof.

Depending on the type of wireless communication system, a wireless communication device, such as a cellular telephone, two-way radio, personal digital assistant (PDA), personal computer (PC), laptop computer, home entertainment equipment, et cetera communicates directly or indirectly with other wireless communication devices. For direct communications (also known as point-to-point communications), the participating wireless communication devices tune their receivers and transmitters to the same channel or channels (e.g., one of the plurality of radio frequency (RF) carriers of the wireless communication system) and communicate over that channel(s). For indirect wireless communications, each wireless communication device communicates directly with an associated base station (e.g., for cellular services) and/or an associated access point (e.g., for an in-home or in-building wireless network) via an assigned channel. To complete a communication connection between the wireless communication devices, the associated base stations and/or associated access points communicate with each other directly, via a system controller, via the public switch telephone network, via the Internet, and/or via some other wide area network.

For each wireless communication device to participate in wireless communications, it includes a built-in radio transceiver (i.e., receiver and transmitter) or is coupled to an associated radio transceiver (e.g., a station for in-home and/or in-building wireless communication networks, RF modem, etc.). As is known, the transmitter of a transceiver includes a data modulation stage, one or more intermediate frequency stages, and a power amplifier. The data modulation stage converts raw data into baseband signals in accordance with the particular wireless communication standard. The one or more intermediate frequency stages mix the baseband signals with the signal generated by one or more local oscillators to produce RF signals. The power amplifier amplifies the RF signals prior to transmission via an antenna.

As is also known, the receiver of a transceiver is also coupled to the antenna and includes a low noise amplifier, one or more intermediate frequency stages, a filtering stage, and a data recovery stage. The low noise amplifier receives an inbound RF signal via the antenna and amplifies it. The one or more intermediate frequency stages mix the amplified RF signal with the signal generated by one or more local oscillators to convert the amplified RF signal into a baseband signal or an intermediate frequency (IF) signal. This is typically referred to as frequency down-conversion. The filtering stage filters the down-converted baseband or IF signal to attenuate unwanted out of band signals to produce a filtered signal that is only that which falls within the bandwidth of the selected channel. Thus, this filter is sometimes referred to as a channel select filter. The data recovery stage recovers raw data from the filtered signal in accordance with the particular wireless communication standard.

As mentioned above, RF signals received by a wireless network transceiver are typically down-converted to intermediate or base-band frequencies by the transceiver before the carrier signals in the channel are processed and ultimately demodulated to extract the transmitted information. Down-conversion requires that the received RF signal be mixed with an oscillator signal having the desired intermediate or base-band frequency to which the received signal is to be down-converted.

The mixing process inherently generates a number of signal components in addition to the converted information signals. These include mirror image or sideband components, as well as distortion and intermodulation components, all of which can interfere with the processing of the received signals within the selected channel. Thus, it is important that the band-pass filter reject the interference components as well as those information signals transmitted in channels other than the selected channel. The degree of attenuation that must be achieved by the filter at frequencies outside the bandwidth of the selected channel is specified by the network designer.

Down-converting to a lower IF or baseband frequency renders implementation of a channel select band-pass filter that meets the performance characteristics specified for a particular wireless protocol significantly easier. For example, it is easier to implement a filter with a transfer function that meets the desired degree of roll-off (i.e. the rate of attenuation) at the frequency boundaries of a channel at IF or baseband frequencies than at RF frequencies. Moreover, the requisite sharpness of the roll-off can be more relaxed at the lower frequencies.

One of the difficulties presented by the integration of radio transceivers on monolithic integrated circuits is that it is difficult to steadily maintain the desired characteristic or transfer function of the channel select filter over the variations in circuit characteristics that result from variations in processing different batches of the integrated circuits, as well as those changes in circuit characteristics due to variations in the ambient temperature and supply voltage. Variations in these parameters can lead to the failure on the part of the channel select filter to maintain the required level of attenuation of the out-of-band signals to the levels specified for the particular design.

Another persistent goal of integrated circuit designers is to reduce the overall cost of system components such as a transceiver, which in turn lowers the cost of systems into which such components are integrated. As is well known, one of the most direct paths to reducing the cost of monolithic integrated circuit components is to minimize the die area consumed by the component's circuitry. Reduction in die area can be achieved in a number of ways, including the simple reduction in the number of components and therefore in the interconnect complexity of the integrated circuit.

Therefore, it would be desirable to provide a filter topology that can render an integrated circuit implementation of a high-order complex filter such as the band-pass channel select filter described above more simply and with less cost in terms of the die area it occupies. It would further be desirable if such a topology rendered the transfer function substantially constant in the face of variations in circuit characteristics typically encountered due to variations in temperature, supply voltage and processing parameters. Finally, it would be highly desirable if the topology could permit the independent tuning of the individual stages of the complex filter, thus rendering the implementation and control of the filter characteristic simple and accurate.

BRIEF SUMMARY OF THE INVENTION

A complex filter, such as the channel select filter of a radio transceiver, is implemented using a transconductance/C topology that permits tuning of the ratio of $g_m/C$ to ensure stability of the poles and zeros required by the filter to achieve its specified transfer function. In one embodiment, the filter is based on an active R/C biquadratic topology, which permits the independent tuning of each stage of the filter. The R in the output impedance can be tuned using a separate tuning circuit independent of the one used to maintain the ratio of $g_m/C$.

In another embodiment, the R is implemented using a transconductance amplifier that is operated with common mode feedback. This enables the filter to be tuned using a single tuning circuit that maintains the $g_m/C$ ratio for all of the devices.

In another embodiment, the transconductance amplifiers are implemented as Nauta transconductors. Nauta transconductors have a common mode circuit designed to maintain the differential and common mode output impedances as high as possible. This embodiment is able to create the R in the output impedance by creating a differential impedance that is equal to R by unbalancing the transconductance values of the inverters in the common mode circuit of the Nauta transconductors. Thus, the value of R (and therefore the location of the poles and zeros) may be maintained using the tuning circuit that is designed to maintain the $g_m/C$ ratio. Moreover, a significant reduction in component count can be realized because no passive components are required, nor does a transconductor have to be dedicated to the production of the R component of the impedance. Additionally, the first of the transconductance amplifiers does not need the common mode circuit normally employed within a Nauta transconductor because of the feedback associated with the gyrator configuration employed by the topology of the invention.

BRIEF DESCRIPTION OF THE SEVERAL VIEWS OF THE DRAWINGS

The transconductance/C complex band-pass filter of the invention may be better understood, and its numerous objectives, features and advantages made apparent to those skilled in the art by referencing the accompanying drawings. The use of the same reference number throughout the several figures designates a like or similar element.

DETAILED DESCRIPTION OF THE INVENTION

Figure 1:
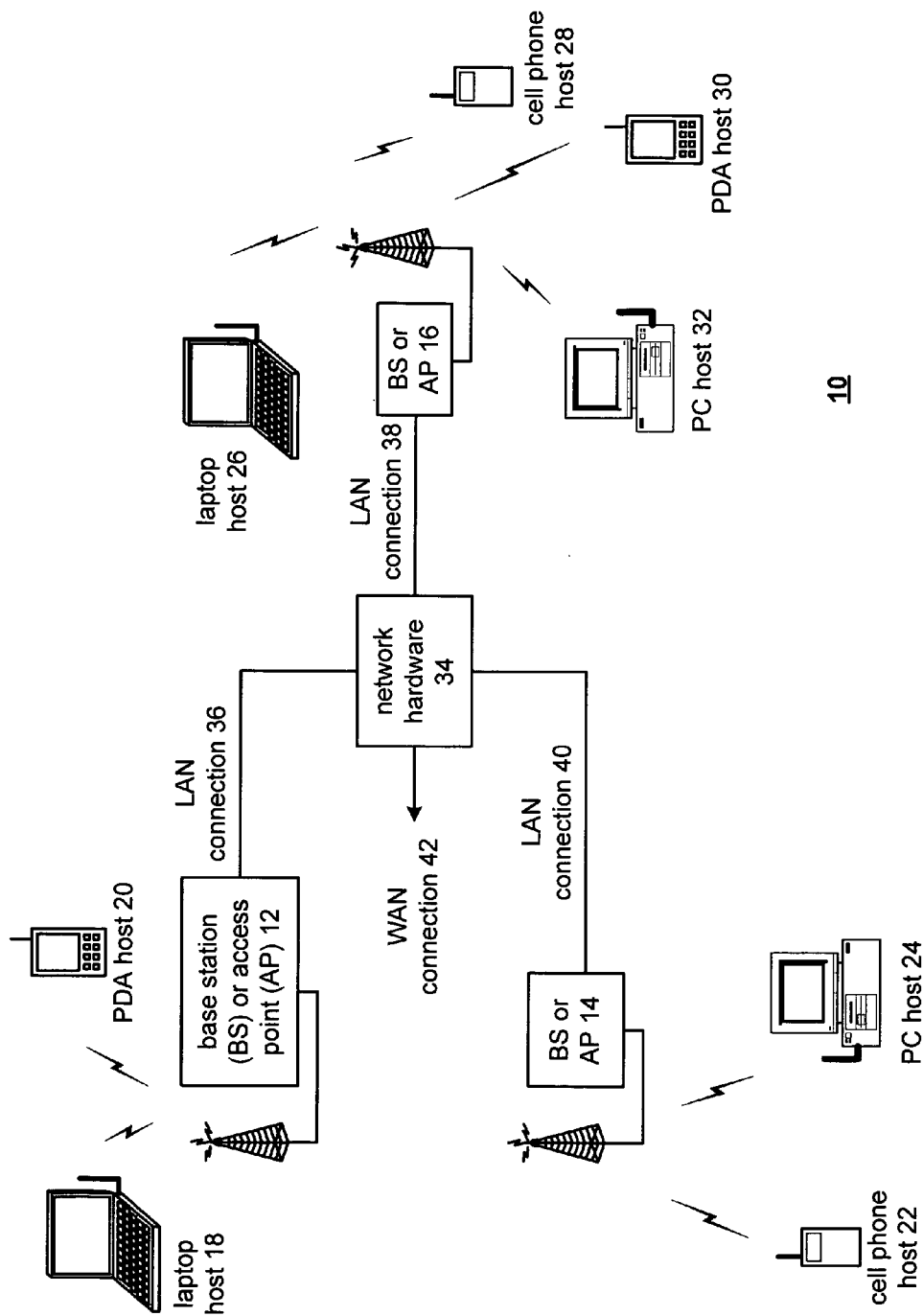
FIG. 1 is a schematic block diagram illustrating a wireless communication system in accordance with the present invention.

FIG. 1 is a schematic block diagram illustrating a communication system 10 that includes a plurality of base stations and/or access points 12-16, a plurality of wireless communication devices 18-32 and a network hardware component 34. The wireless communication devices 18-32 may be laptop host computers 18 and 26, personal digital assistant hosts 20 and 30, personal computer hosts 24 and 32 and/or cellular telephone hosts 22 and 28. The details of the wireless communication devices will be described in greater detail with reference to FIG. 2.

The base stations or access points 12-16 are operably coupled to the network hardware 34 via local area network connections 36, 38 and 40. The network hardware 34, which may be a router, switch, bridge, modem, system controller, et cetera, provides a wide area network connection 42 for the communication system 10. Each of the base stations or access points 12-16 has an associated antenna or antenna array to communicate with the wireless communication devices in its area. Typically, the wireless communication devices register with a particular base station or access point 12-14 to receive services from the communication system 10. For direct connections (i.e., point-to-point communications), wireless communication devices communicate directly via an allocated channel.

Typically, base stations are used for cellular telephone systems and like-type systems, while access points are used for in-home or in-building wireless networks. Regardless of the particular type of communication system, each wireless communication device includes a built-in radio and/or is coupled to a radio. The radio includes a highly stable and area efficient channel select filter topology as disclosed herein to enhance performance, reduce costs, reduce size, and/or enhance broadband applications.

Figure 2:
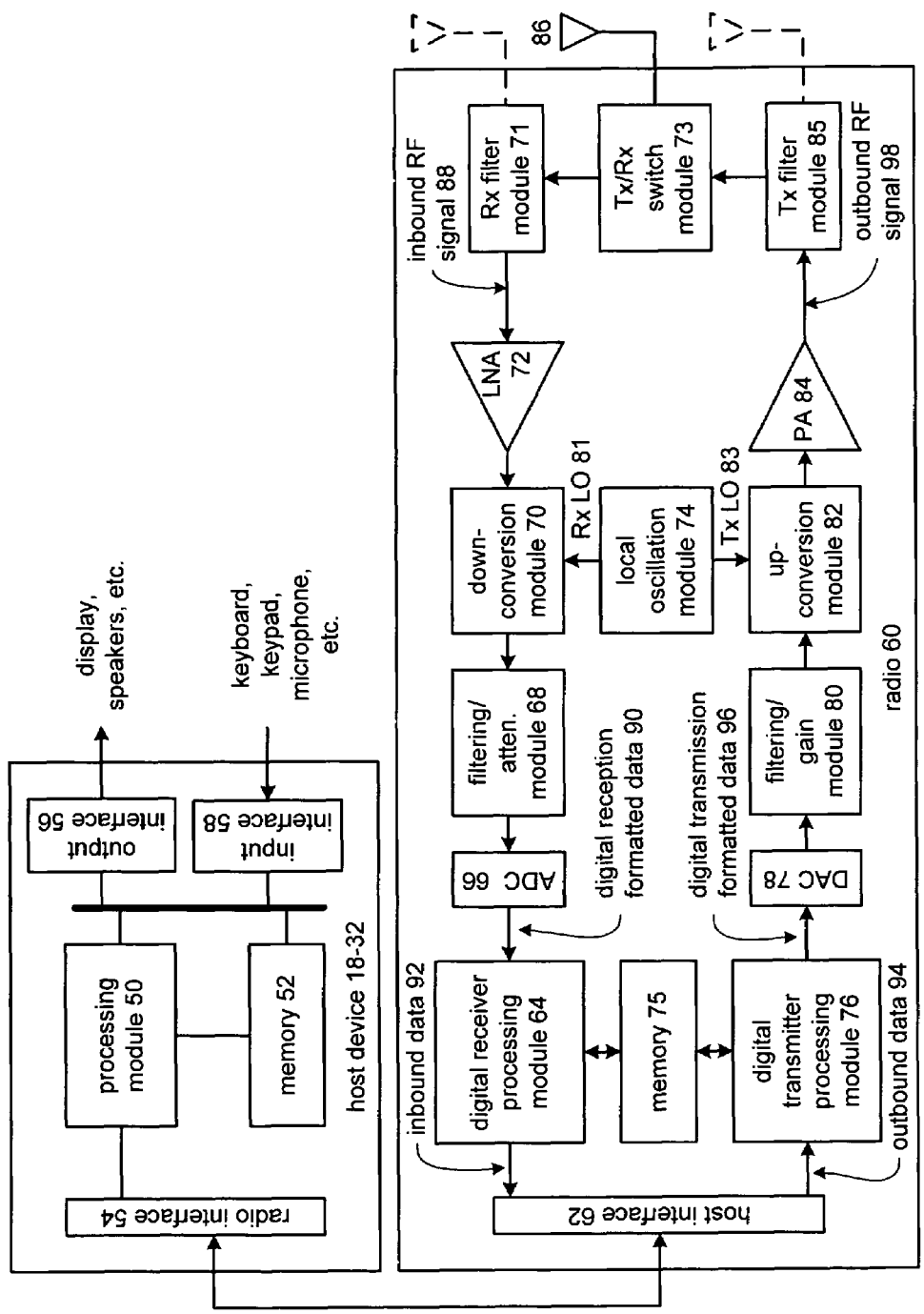
FIG. 2 is a schematic block diagram illustrating a wireless communication device in accordance with the present invention.

FIG. 2 is a schematic block diagram illustrating a wireless communication device that includes the host device 18-32 and an associated radio 60. For cellular telephone hosts, the radio 60 is a built-in component. For personal digital assistant hosts, laptop hosts, and/or personal computer hosts, the radio 60 may be built-in or an externally coupled component.

As illustrated, the host device 18-32 includes a processing module 50, memory 52, radio interface 54, input interface 58 and output interface 56. The processing module 50 and memory 52 execute the corresponding instructions that are typically performed by the host device. For example, for a cellular telephone host device, the processing module 50 performs the corresponding communication functions in accordance with a particular cellular telephone standard.

The radio interface 54 allows data to be received from and sent to the radio 60. For data received from the radio 60 (e.g., inbound data), the radio interface 54 provides the data to the processing module 50 for further processing and/or routing to the output interface 56. The output interface 56 provides connectivity to an output device such as a display, monitor, speakers, et cetera such that the received data may be displayed. The radio interface 54 also provides data from the processing module 50 to the radio 60. The processing module 50 may receive the outbound data from an input device such as a keyboard, keypad, microphone, et cetera via the input interface 58 or generate the data itself. For data received via the input interface 58, the processing module 50 may perform a corresponding host function on the data and/or route it to the radio 60 via the radio interface 54.

Radio 60 includes a host interface 62, digital receiver processing module 64, an analog-to-digital converter 66, a filtering/attenuation module 68, an IF mixing down conversion stage 70, a receiver filter 71, a low noise amplifier 72, a transmitter/receiver switch 73, a local oscillation module 74, memory 75, a digital transmitter processing module 76, a digital-to-analog converter 78, a filtering/gain module 80, an IF mixing up conversion stage 82, a power amplifier 84, a transmitter filter module 85, and an antenna 86. The antenna 86 may be a single antenna that is shared by the transmit and receive paths as regulated by the Tx/Rx switch 77, or may include separate antennas for the transmit path and receive path. The antenna implementation will depend on the particular standard to which the wireless communication device is compliant.

The digital receiver processing module 64 and the digital transmitter processing module 76, in combination with operational instructions stored in memory 75, execute digital receiver functions and digital transmitter functions, respectively. The digital receiver functions include, but are not limited to, digital intermediate frequency to baseband conversion, demodulation, constellation demapping, decoding, and/or descrambling. The digital transmitter functions include, but are not limited to, scrambling, encoding, constellation mapping, modulation, and/or digital baseband to IF conversion.

The digital receiver and transmitter processing modules 64 and 76 may be implemented using a shared processing device, individual processing devices, or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on operational instructions.

The memory 75 may be a single memory device or a plurality of memory devices. Such a memory device may be a read-only memory, random access memory, volatile memory, non-volatile memory, static memory, dynamic memory, flash memory, and/or any device that stores digital information. Note that when the processing module 64 and/or 76 implements one or more of its functions via a state machine, analog circuitry, digital circuitry, and/or logic circuitry, the memory storing the corresponding operational instructions is embedded with the circuitry comprising the state machine, analog circuitry, digital circuitry, and/or logic circuitry. The memory 75 stores, and the processing module 64 and/or 76 executes operational instructions corresponding to signal processing functions performed on the received and transmitted signals.

In operation, the radio 60 receives outbound data 94 from the host device via the host interface 62. The host interface 62 routes the outbound data 94 to the digital transmitter processing module 76, which processes the outbound data 94 in accordance with a particular wireless communication standard (e.g., IEEE802.11a, IEEE802.11b, Bluetooth, et cetera) to produce digital transmission formatted data 96. The digital transmission formatted data 96 will be a digital base-band signal or a digital low IF signal, where the low IF typically will be in the frequency range of one hundred kilohertz to a few megahertz.

The digital-to-analog converter 78 converts the digital transmission formatted data 96 from the digital domain to the analog domain. The filtering/gain module 80 filters and/or adjusts the gain of the analog signal prior to providing it to the IF mixing stage 82. The IF mixing stage 82 directly converts the analog baseband or low IF signal into an RF signal based on a transmitter local oscillation 83 provided by local oscillation module 74. The power amplifier 84 amplifies the RF signal to produce outbound RF signal 98, which is filtered by the transmitter filter module 85. The antenna 86 transmits the outbound RF signal 98 to a targeted device such as a base station, an access point and/or another wireless communication device.

The radio 60 also receives an inbound RF signal 88 via the antenna 86, which was transmitted by a base station, an access point, or another wireless communication device. The antenna 86 provides the inbound RF signal 88 to the receiver filter module 71 via the Tx/Rx switch 77, where the Rx filter 71 bandpass filters the inbound RF signal 88. The Rx filter 71 provides the filtered RF signal to low noise amplifier 72, which amplifies the signal 88 to produce an amplified inbound RF signal. The low noise amplifier 72 provides the amplified inbound RF signal to the IF mixing module 70, which directly converts the amplified inbound RF signal into an inbound low IF signal or baseband signal based on a receiver local oscillation 81 provided by local oscillation module 74. The down conversion module 70 provides the inbound low IF signal or baseband signal to the filtering/attenuation module 68. The filtering/attenuation module 68 may be implemented in accordance with the teachings of the present invention to filter and/or attenuate the inbound low IF signal or the inbound baseband signal to produce a filtered inbound signal, effectively selecting one of the channels of the RF broadband signal.

The analog-to-digital converter 66 converts the filtered inbound signal from the analog domain to the digital domain to produce digital reception formatted data 90. The digital receiver processing module 64 decodes, descrambles, demaps, and/or demodulates the digital reception formatted data 90 to recapture inbound data 92 in accordance with the particular wireless communication standard being implemented by radio 60. The host interface 62 provides the recaptured inbound data 92 to the host device 18-32 via the radio interface 54.

As one of average skill in the art will appreciate, the wireless communication device of FIG. 2 may be implemented using one or more integrated circuits. For example, the host device may be implemented on one integrated circuit, the digital receiver processing module 64, the digital transmitter processing module 76 and memory 75 may be implemented on a second integrated circuit, and the remaining components of the radio 60, less the antenna 86, may be implemented on a third integrated circuit. As an alternate example, the radio 60 may be implemented on a single integrated circuit. As yet another example, the processing module 50 of the host device and the digital receiver and transmitter processing modules 64 and 76 may be a common processing device implemented on a single integrated circuit. Further, the memory 52 and memory 75 may be implemented on a single integrated circuit and/or on the same integrated circuit as the common processing modules of processing module 50 and the digital receiver and transmitter processing module 64 and 76.

Figure 3:
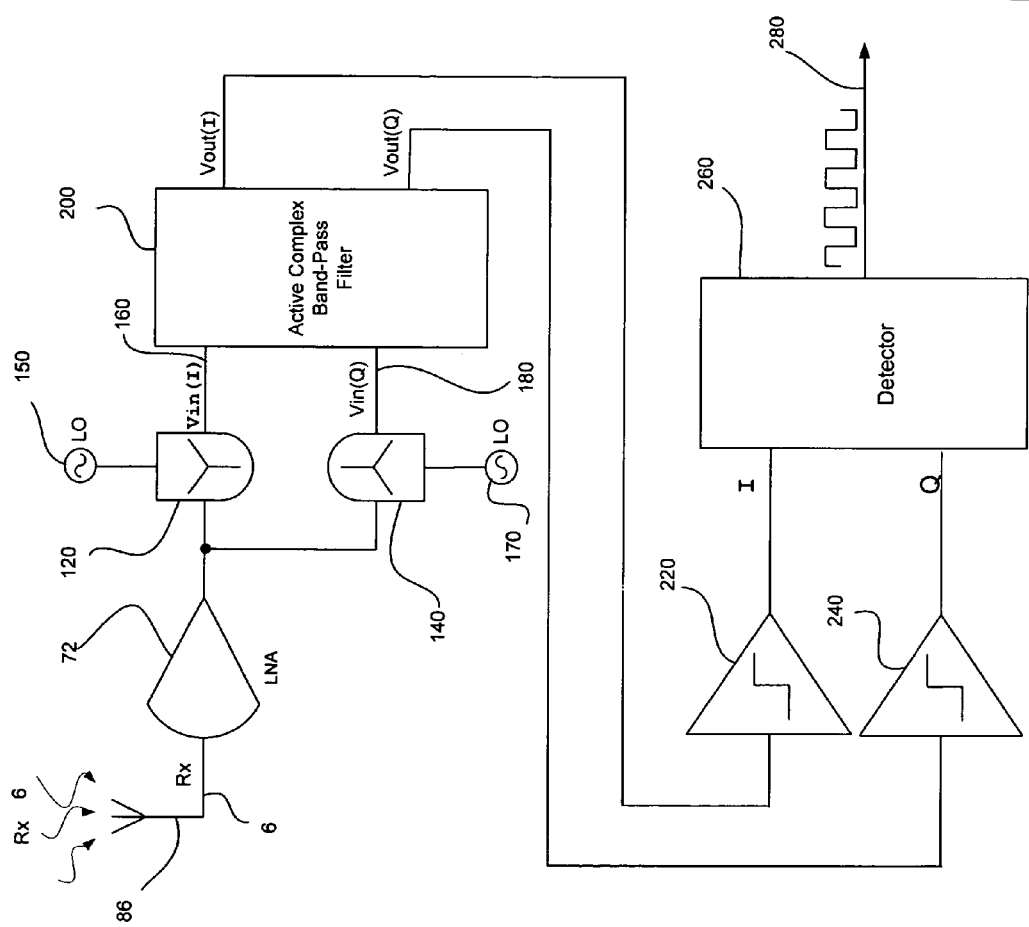
FIG. 3 illustrates a schematic block diagram illustrating the receive path of a wireless transceiver.

FIG. 3 illustrates the down-conversion and channel discrimination functions commonly performed in a receiver as previously described. RF signal Rx 6 is received at antenna 86 and amplified by LNA (low noise amplifier) 72. For a Bluetooth as well as an IEEE 802.11a or 802.11b wireless network, the frequency of broadband signal Rx 6 is typically centered about 2.4 GHz. The Rx signal 6 typically contains information that has been encoded within each of its channels using one of a number of well-known modulation techniques. In the case of a Bluetooth network for example, Gaussian shift key modulation (GPSK) may be employed. The amplified Rx signal may be down-converted in quadrature to produce two versions of the down-converted Rx signal centered at an IF frequency. This process is performed by mixing the Rx signal with local oscillator signals 150 and 170 (corresponding to local oscillator module 74 of FIG. 2) using mixers 120 and 140 respectively (corresponding to down-conversion module 70 of FIG. 2). The down-converted version of the signal generated on the Q channel 180 is phase shifted by 90 degrees with respect to the version of the signal generated over the I channel 160.

The use of the two channels in quadrature permits use of an active complex filter topology, which can inherently reduce the signal level of certain mirror image signal components that are generated as a result of the down-conversion process. Polyphase band-pass filter 200 is driven in quadrature by the two channels I 160 and Q 180, and its characteristic is adjusted to tune the filter to the intermediate frequency of one particular channel carrier signal. The characteristic of filter 200 is designed to reject all other channels as well as interference and other signal components generated by the mixing process that fall outside of the pass-band of the filter. The degree of rejection that is required by the system is specified by the system designer. The two phases (i.e. I and Q) of the selected channel are then processed by limiters 220 and 240, and then passed to detector 260. Detector 260 demodulates the filtered signal(s) to produce a bit stream representative of the information encoded in the modulated carrier signals.

As previously mentioned, the characteristic required of the channel select filter is typically specified in advance by those designing the system. The characteristic is inferred from the degree to which signals outside of the desired channel must be rejected as dictated by the particular network application. For example, applications such as a Bluetooth network typically employ a $5^{th}$ order polyphase resonator filter having medium to high Q to meet the specified attenuation characteristics.

Figure 4:
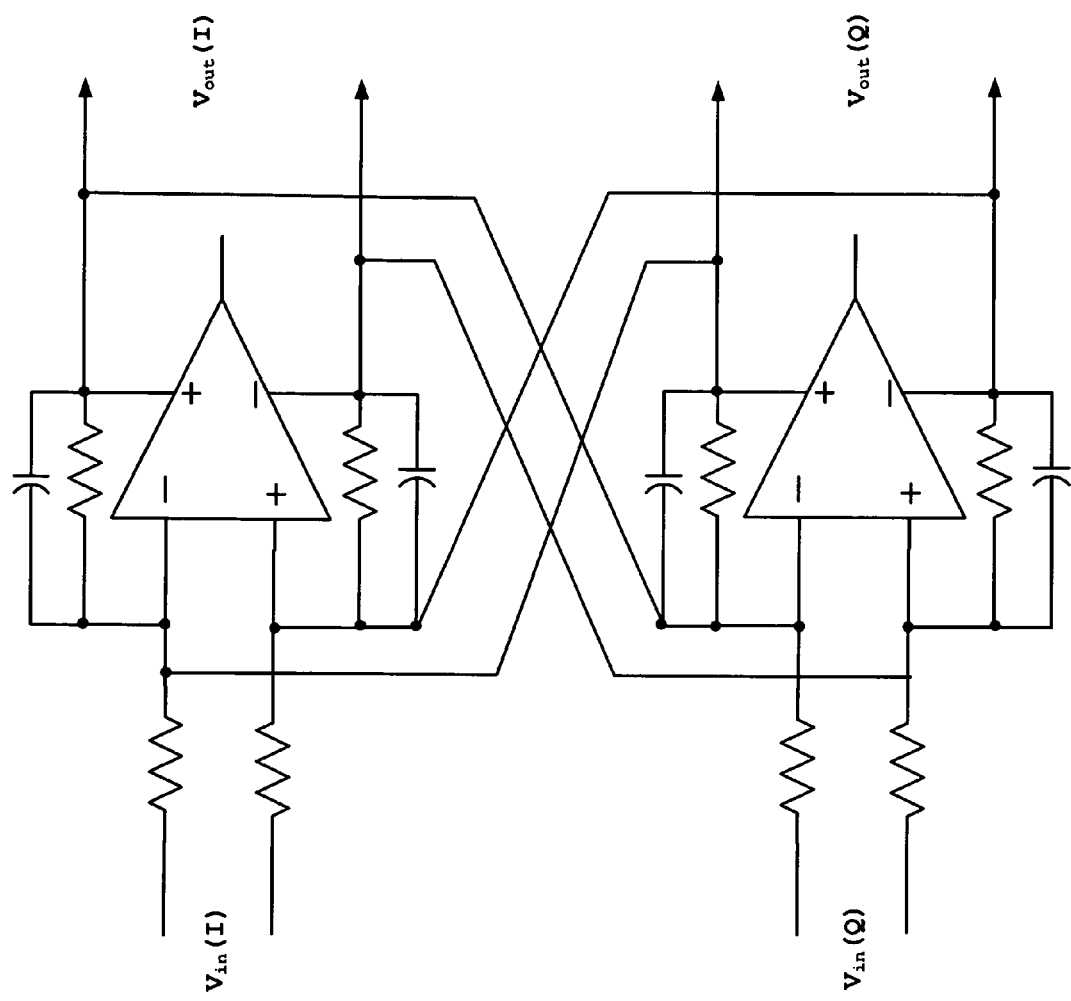
FIG. 4 is a circuit schematic illustrating one stage of a complex filter employing operational amplifiers in a known biquadratic active RC filter topology of the prior art.

One topology commonly employed in the past to implement the channel select filter is based on operational amplifiers as its primary components. FIG. 4 illustrates the implementation of one of the n stages required for an $n^{th}$ order active polyphase RC filter. It will be readily apparent to one of ordinary skill in the art that this band-pass filter implementation will occupy a significant percentage of the die area for a transceiver manufactured as an integrated circuit. As can be seen from FIG. 4, each stage of this $n^{th}$ order polyphase filter requires six resistors, four capacitors, and two operational amplifiers.

In addition to the large number of components, either the resistors or the capacitors tend to be of a large value (and therefore consume significant die area) to achieve the pole(s) to implement the complex filter's transfer function (this is especially true when a low IF is required for the down-conversion). Moreover, this implementation does not lend itself well to controlling the characteristic of the filter over temperature, voltage and processing variations because there is more than one component that must be controlled (i.e. the resistor and capacitor). On the other hand, one advantage to implementing the filter in accordance with FIG. 4 is that each of the n stages can be individually controlled which makes achieving the desired filter characteristic much easier than a passive topology (i.e. using all passive components such as resistors, inductors and capacitors), where all of the stages are interrelated with one another so that adjusting component values of one stage will affect the operation of all of the stages.

Figure 5:
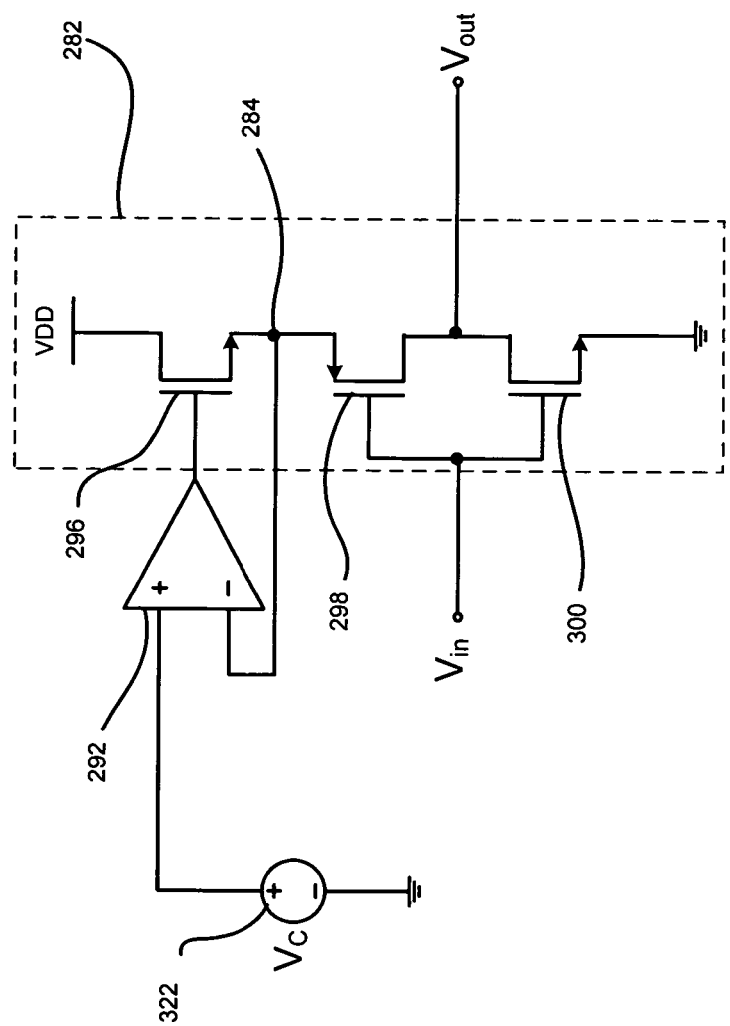
FIG. 5 illustrates a transconductance amplifier implemented as an inverter using the supply voltage to control the output current and therefore the value of the transconductance of the amplifier.

It is known in the art that implementing a complex filter such as a polyphase filter using transconductors and capacitors can result in a significantly more stable filter. This is because the transconductors and capacitance values can be controlled in a manner that eliminates the variations in transconductance (i.e. $g_m$) and capacitance (i.e. C) as a function of temperature, supply voltage and process variations. FIG. 5 illustrates one simple embodiment of a transconductor inverter that can be used to build a $g_m/C$ filter. A correction or tuning signal $V_C$ 322 is generated that is input to a voltage regulator circuit comprising amplifier 292 and n-channel device 296. The supply voltage seen by the inverter made up of devices 298 and 300, along with the device sizes (i.e. W/L) will determine the transconductance $g_m$ of the inverter. Thus, as the variations in process lead to variations in the values of W and L, or as the supply voltage VDD is varied, a correctly generated $V_C$ 322 can adjust the supply voltage seen by the inverter and thus its $g_m$ to maintain a desired value of $g_m$.

Figure 6:
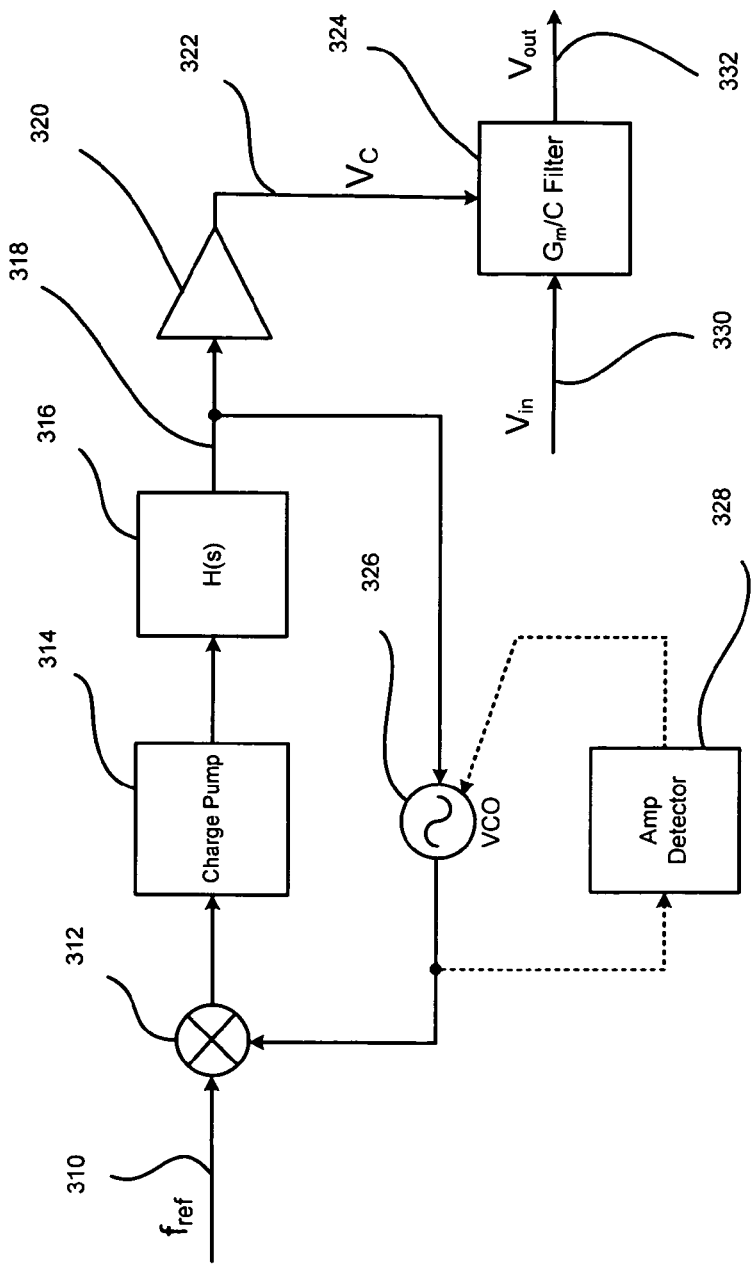
FIG. 6 is a schematic block diagram illustrating a tuning circuit used to control the supply voltage of one or more transconductance amplifiers to maintain the transconductance value of the one or more amplifiers at a desired value over temperature, supply voltage and processing variations.

FIG. 6 illustrates a phase locked loop (i.e. PLL) circuit for generating an appropriate $V_C$ 322 control signal to maintain a proper ratio between the $g_m$ and C of a $g_m/C$ filter that is configured using $g_m$ inverters such as the inverter 282 of FIG. 5. The PLL of FIG. 6 includes a voltage controlled oscillator (i.e. VCO) 326 that generates a signal that is phase compared to a reference frequency $f_{ref}$ 310 by phase detector 312. Any difference in phase or frequency is converted to an error signal through charge pump 314 and loop filter 316. The error or tuning voltage 318 is fed back to the VCO to correct the phase difference, and is buffered through amplifier 320 and fed to the transconductor inverters of filter $g_m/C$ 324 as shown in FIG. 5. The VCO is constructed of the same transconductor inverters as the filter 324, and is corrected in the same manner. Thus, by eliminating any variation in the ratio of $g_m/C$ that causes a phase difference between the VCO output and the reference frequency also eliminates the variation in the filter that would cause a shift in the characteristic.

Past implementations of the channel select filter of a transceiver as a $g_m/C$ filter have been based on a passive filter design that achieves the desired characteristic using a passive filter topology implemented with capacitors and inductors, but no resistors. This is contrasted with the active biquadratic implementation of FIG. 4, which inherently has a parallel RC load impedance. Eliminating resistors using the passive filter design removes resistor values from the transfer function of the $g_m/C$ filter, and thus the transfer function can be tuned simply on the basis of the $g_m/C$ ratio as previously discussed. For the $g_m/C$ implementation, the capacitors of the passive filter topology are implemented as capacitors, and the inductors are implemented using transconductance amplifiers coupled in a known gyrator configuration. These prior $g_m/C$ filter implementations have a large number of components and, because they are typically polyphase in nature, they are themselves active filters. While they produce filters that are reasonably stable over temperature, supply voltage and process, because they are based on a passive implementation, they do not share the advantage of independently controlled stages as do active biquadratic implementations based on the stage illustrated in FIG. 4.

Figure 7A:
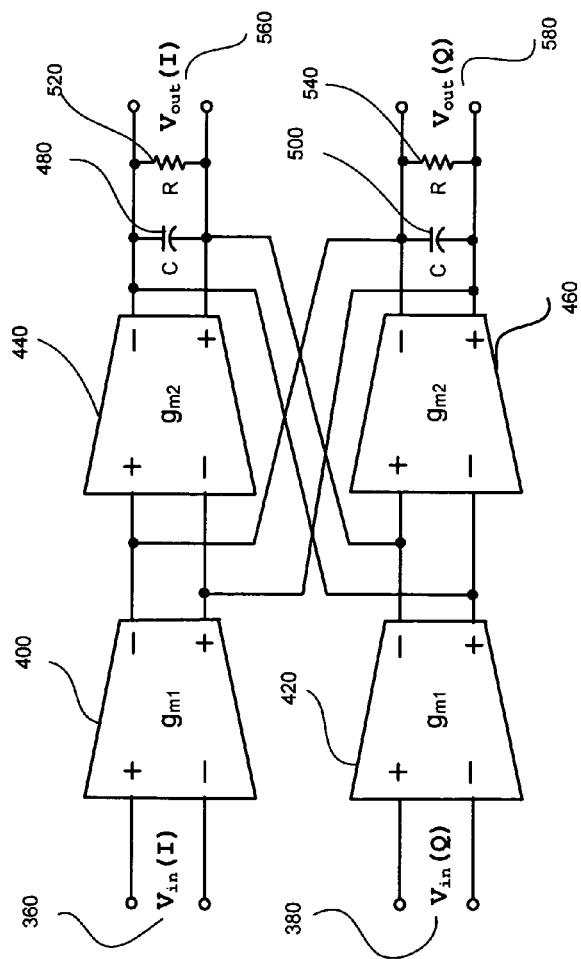
FIG. 7A is a schematic circuit diagram illustrating one embodiment of a single-stage complex filter having a differential input and employing a $g_m/C$ active RC filter topology in accordance with the present invention.

A detailed description of one embodiment of the $g_m/C$ filter topology of the present invention is illustrated in FIG. 7A. The embodiment shown in FIG. 7A is a single-stage polyphase filter that is based on the biquadratic topology of FIG. 4. The filter stage is driven differentially in quadrature at inputs $V_{in}(I)$ 360 and $V_{in}(Q)$ 380 respectively. Differential inputs 360, 380 of the stage can be coupled to outputs I 160 and Q 180 of mixers 120 and 140 respectively as shown in FIG. 3 for use in a radio transceiver. Transconductors 400 and 420 of FIG. 7A each have a transconductance of $g_{m1}$. Transconductors 440 and 460 each have a transconductance of $g_{m2}$, the inputs and outputs of which are coupled together in a gyrator configuration. Transconductors 440 and 460 each have a capacitor 480, 500 and a resistor 520, 540 coupled across their differential outputs $V_{out}(I)$ 560, $V_{out}(Q)$ 580 respectively.

Figure 7B:
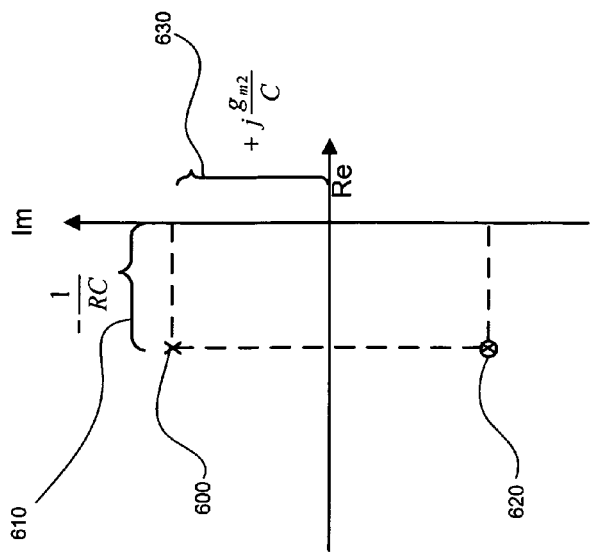
FIG. 7B is a pole-zero diagram for the single-stage differential input $g_m/C$ complex filter topology of FIG. 7A.

FIG. 7B illustrates the pole-zero diagram for the $g_m/C$ single-stage polyphase filter of FIG. 7A. The transfer function from the $V_{in}(I)$ input 360 to the $V_{out}(I)$ output 560 (as well as the $V_{in}(Q)$ input 380 to the $V_{out}(Q)$ output 580) is given by the equation:

$$H_{II}(s) = H_{QQ}(s) = \frac{g_{m1}g_{m2}R^2}{s^2(RC)^2 + s2RC + 1 + g_{m2}^2R^2}.$$

The transfer function from the $V_{in}(I)$ input 360 to the $V_{out}(Q)$ output 580 (and the $V_{in}(Q)$ input 380 to the I output 560) is given by:

$$H_{IQ}(s) = H_{QI}(s) = \frac{g_{m1}R(sRC+1)}{s^2(RC)^2 + s2RC + 1 + g_{m2}^2R^2}.$$

The poles are defined by the equation $$p_{1,2} = -\frac{1}{RC} \pm j\frac{g_{m2}}{C}.$$

The resonance frequency is given by $$\omega_0 = \frac{g_{m2}}{C}.$$

The value of the filter's Q is given by $$Q = \frac{1}{2}\sqrt{1 + (g_{m2}R)^2}.$$

For the $H_{IQ}(S)$ and $H_{QI}(S)$ transfer functions, there is a zero defined by $$Z = -\frac{1}{RC}.$$

Thus, the voltage at the $V_{out}(I)$ output 560 is given by:

$$V_{outI} = H_{II}(s)V_{inI} + H_{QI}(s)V_{inQ} = \frac{g_{m1}R(g_{m2}RV_{inI} + (sRC+1)V_{inQ})}{s^2(RC)^2 + s2RC + 1 + g_{m2}^2R^2}.$$

If the two inputs 360, 380 are in quadrature (i.e. $V_{inI}=j$ and $V_{inQ}=1$) the foregoing equation becomes $$V_{outI} = H_{II}(s)V_{inI} + H_{QI}(s)V_{inQ} = \frac{g_{m1}R(jg_{m2}R + sRC + 1)}{s^2(RC)^2 + s2RC + 1 + g_{m2}^2R^2}$$

which has a zero at $$z_1 = -\frac{1}{RC} - j\frac{g_{m2}}{C}.$$

From this, it can be seen that one of the poles will be canceled by $z_1$, which leads to rejection of the image component. Thus, the polyphase filter stage of FIG. 7A implements a single pole, and if driven in quadrature, eliminates the mirror image due to the cancellation of a pole by a zero. The pole may be placed arbitrarily by simply changing the values of R, C and $g_m2$. FIG. 7B is a pole zero plot for the filter stage of FIG. 7A. It can be seen that the zero $Z_1$ is canceled by the pole $P_2$ at 620, and the pole $P_1$ at 600 is dictated by $$-\frac{1}{RC}$$

on the real axis and $$-\frac{g_{m2}}{C}$$

on the imaginary axis.

Figure 8:
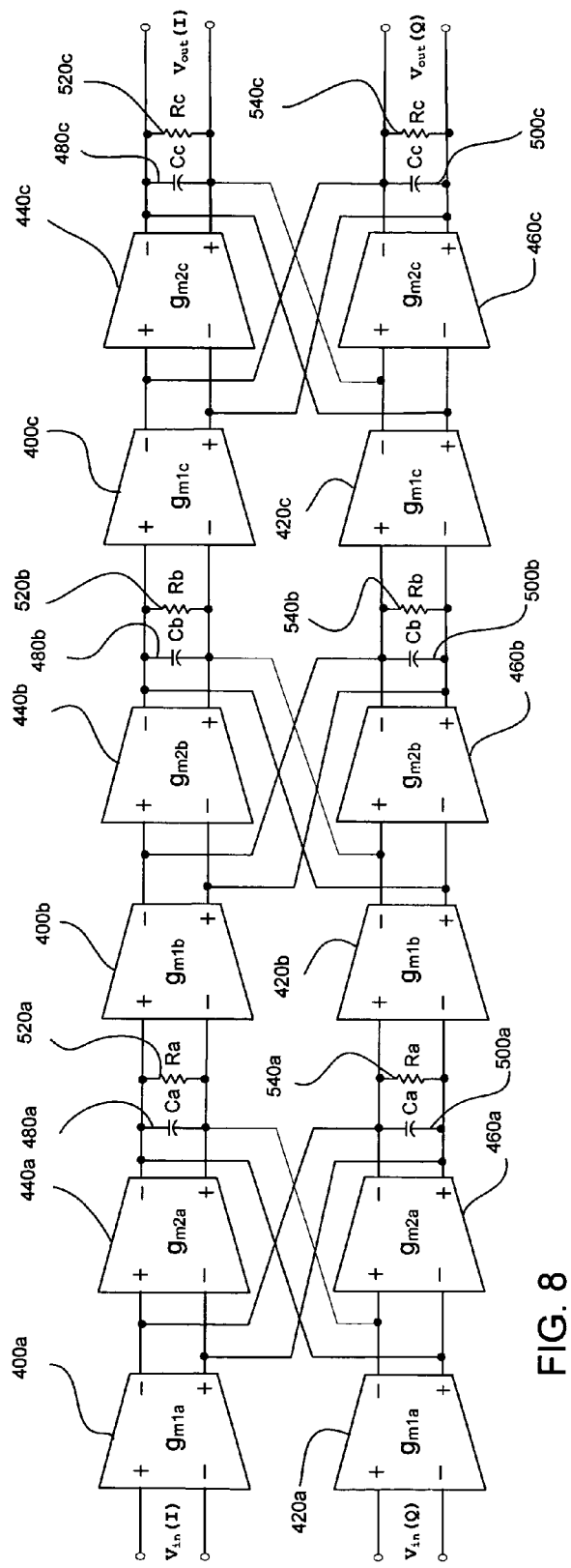
FIG. 8 illustrates one embodiment of a $3^{rd}$ order complex filter having differential inputs and outputs and employing the $g_m/C$ active RC filter topology in accordance with the invention.
Figure 9:
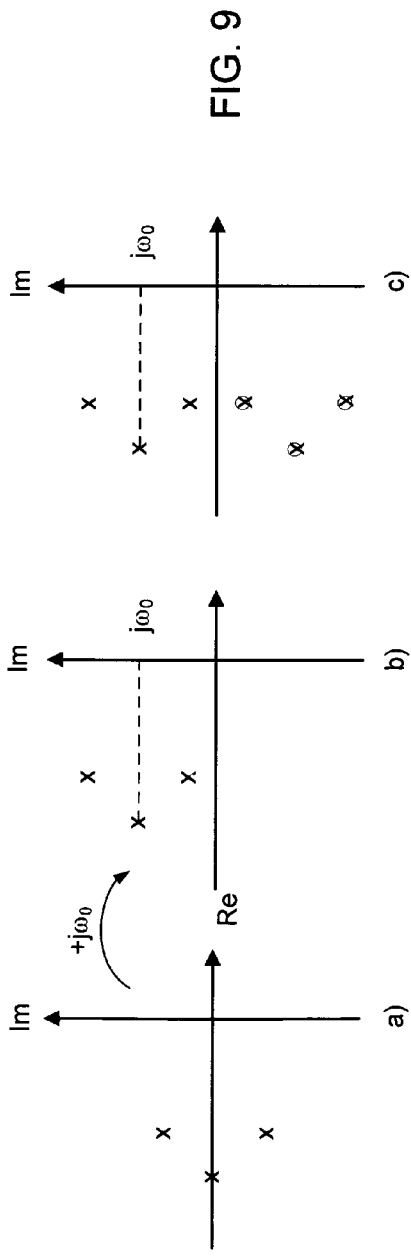
FIGS. 9A-B together illustrate the translation of a $3^{rd}$ order $g_m/C$ low-pass filter in the pole-zero plane.
FIG. 9C illustrates the pole-zero diagram for a $3^{rd}$ order complex filter that can be implemented in accordance with the topology of FIG. 8.

The first transconductance $g_m1$ sets the gain of the stage and provides a buffer for when stages are concatenated to implement an nth order filter. FIG. 8 illustrates a $3^{rd}$ order band-pass filter based on the stage of FIG. 7A. In designing the band-pass filter, one can start with a $3^{rd}$ order low-pass filter with half of the bandwidth of the desired band-pass filter. The poles of such a band-pass filter can then be translated up in frequency in accordance with the following equation: $P_{BP}=P_{LP}+j\omega_0$, where $\omega_0$ is the center frequency of the band-pass filter. This translation is illustrated in FIGS. 7A and 7B. The pole-zero diagram for the $3^{rd}$ order filter of FIG. 8, which is shown as a series of three of the single-stage filter of FIG. 5A, is shown in FIG. 9C.

Figure 7C:
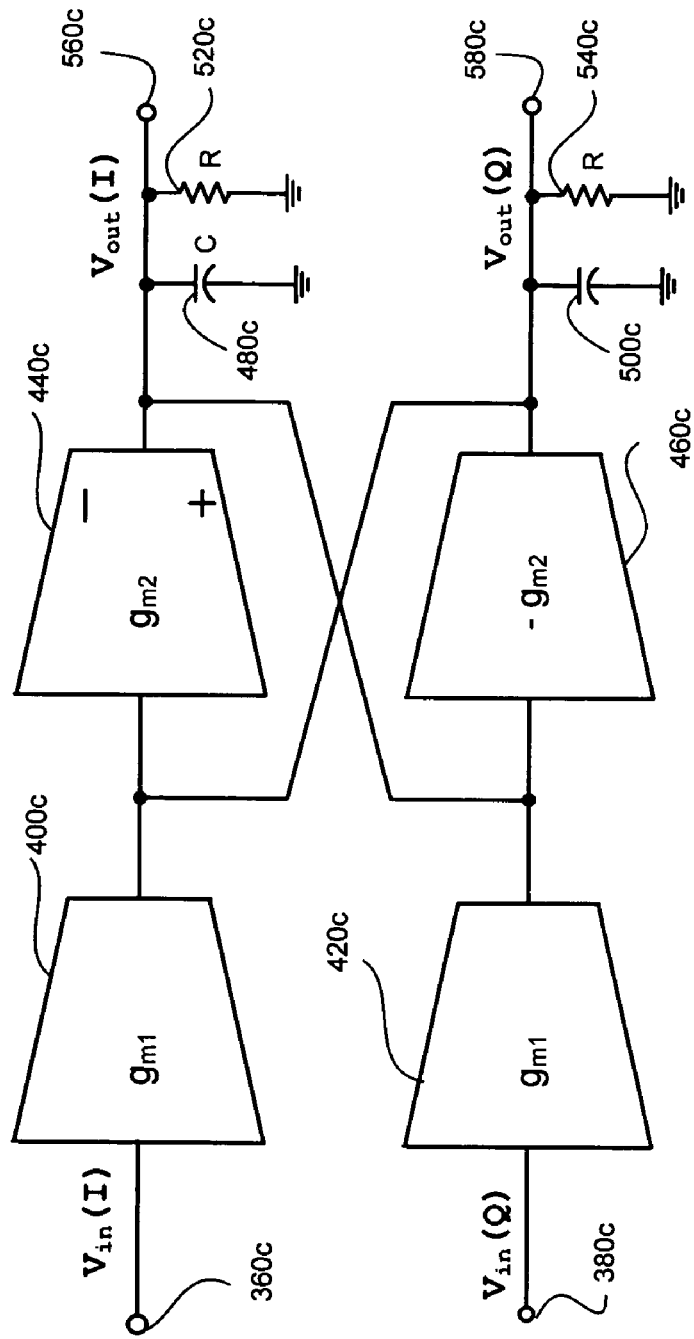
FIG. 7C is a schematic circuit diagram illustrating one embodiment of a single-stage complex filter having a single-ended input and employing a $g_m/C$ active RC filter topology in accordance with the present invention.
Figure 7D:
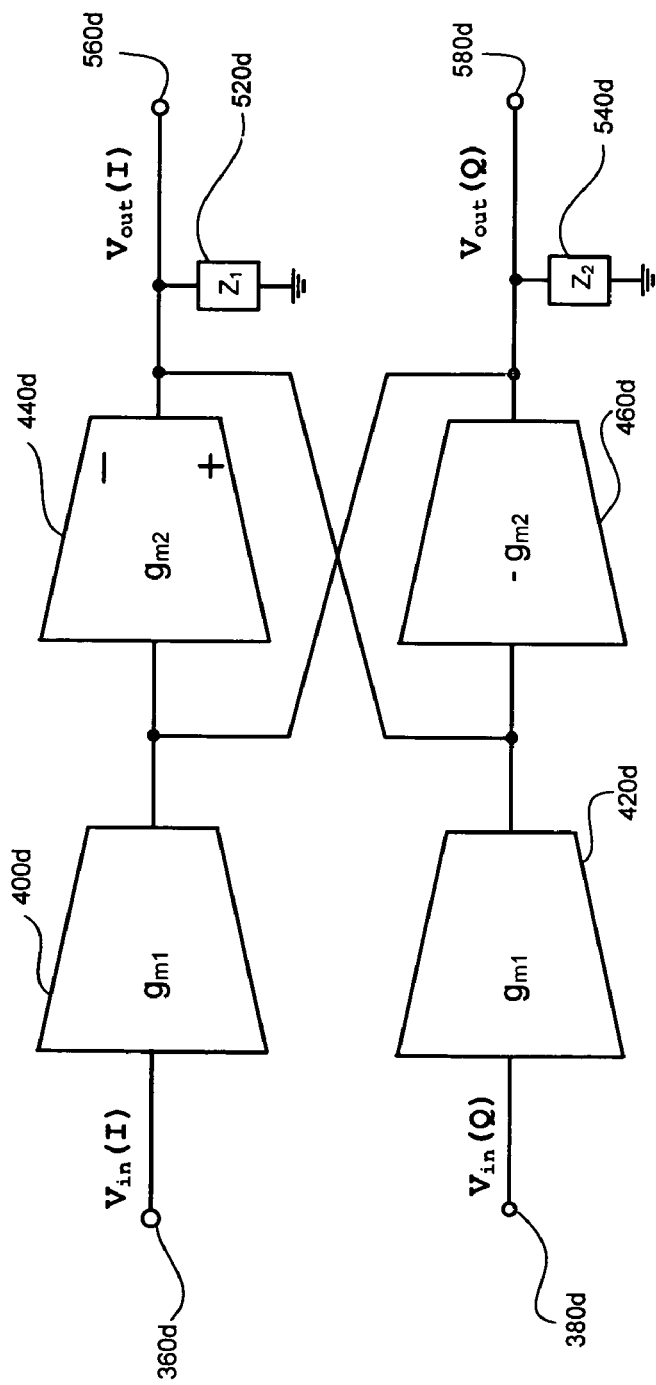
FIG. 7D is a schematic circuit diagram illustrating one embodiment of a single-stage complex filter having a single-ended input and employing a $g_m/C$ active filter topology with generalized impedances Z1 and Z2 in accordance with the present invention.

FIG. 7C illustrates a single-ended version of the single-stage filter of FIG. 5A. The transconductance amplifier 460C is a $-g_m2$. FIG. 7D illustrates a more generic topology for any impedance Z1 and Z2. In the generic case, the transfer functions are as follows:

$$H_{II}(s) = H_{QQ}(s) = \frac{Vin(I)}{Vout(I)} = \frac{g_{m1}g_{m2}Z_1Z_2}{1 + g_{m2}^2Z_1Z_2};$$

$$H_{QI}(s) = \frac{Vin(Q)}{Vout(I)} = \frac{g_{m1}Z_1}{1 + g_{m2}^2Z_1Z_2}; \text{ and}$$

$$H_{IQ}(s) = \frac{Vin(I)}{Vout(Q)} = \frac{g_{m1}Z_2}{1 + g_{m2}^2Z_1Z_2};$$

where $$Z_1 = Z_2 = -\frac{R}{1 + sRC}$$

for the case of the biquadratic topology having the parallel RC output impedance.

One problem with the embodiment of FIGS. 7A and 7C, as applied to FIG. 8 is that, because it is based on the biquadratic topology of FIG. 4, the resistors $R_a$, $R_b$ and $R_c$ (560a, 540a, 560b, 540b, 560c, and 540c) that are derived from the parallel RC output impedance of the biquadratic topology make it difficult to maintain the pole positions in their desired locations in the pole-zero plane over variations in process, temperature and supply voltage using the tuning technique previously discussed. A separate tuning circuit would have to be used to maintain the real and imaginary terms constant over the noted variations.

Figure 10A:
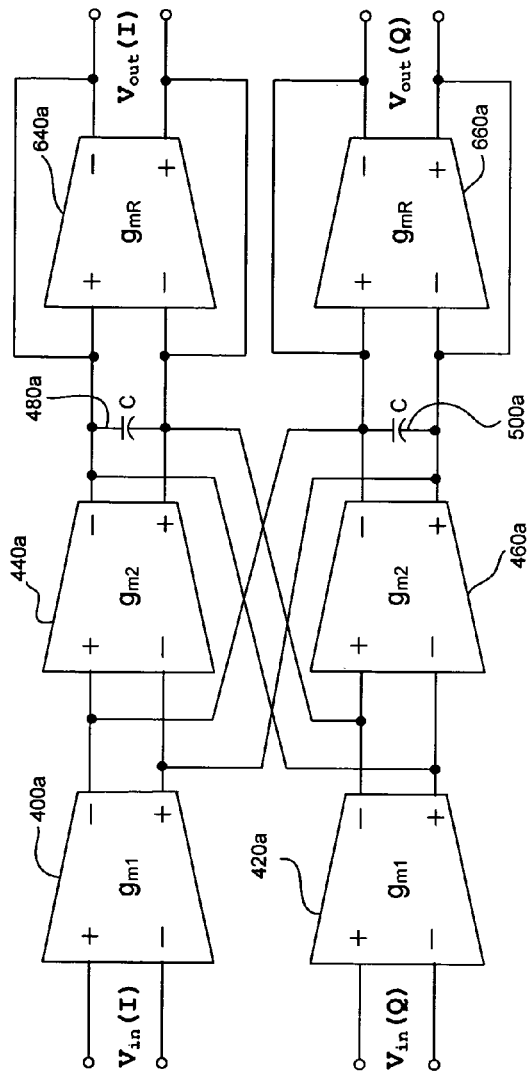
FIG. 10A illustrates one embodiment of the single-stage complex filter with differential inputs and outputs of FIG. 9B with the resistive components implemented as a function of the transconductance of a transconductance amplifier.
Figure 10B:
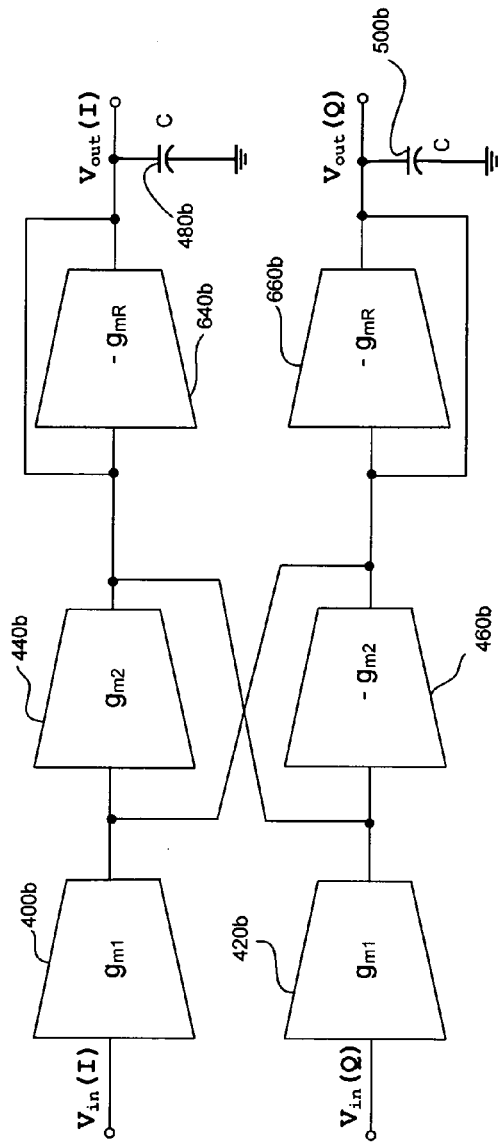
FIG. 10B illustrates one embodiment of the single-stage complex filter with single-ended inputs and outputs of FIG. 9C with the resistive components implemented as a function of the transconductance of a transconductance amplifier.

To facilitate use of the simpler control process, one embodiment of the invention as illustrated in FIG. 10A (as a differential implementation of a single stage) implements the resistors using transconductances $g_{mR}$ 640a and 660a in a common mode feedback configuration. By doing so, the real term (610, FIG. 5B) given by $$-\frac{1}{RC}$$

now becomes $$-\frac{g_{mR}}{C}$$

such that both terms, including the imaginary term (630, FIG. 5B) are both a function of capacitance and transconductance. Thus, the embodiment of FIG. 10A provides the benefit of independently controlled stages that is characteristic of the biquadratic topology while also providing the benefit of easily tuning the filter that heretofore has been a characteristic of the passive-based $g_m/C$ topology. FIG. 10B illustrates a single-ended version of the embodiment of FIG. 10A.

Figure 11:
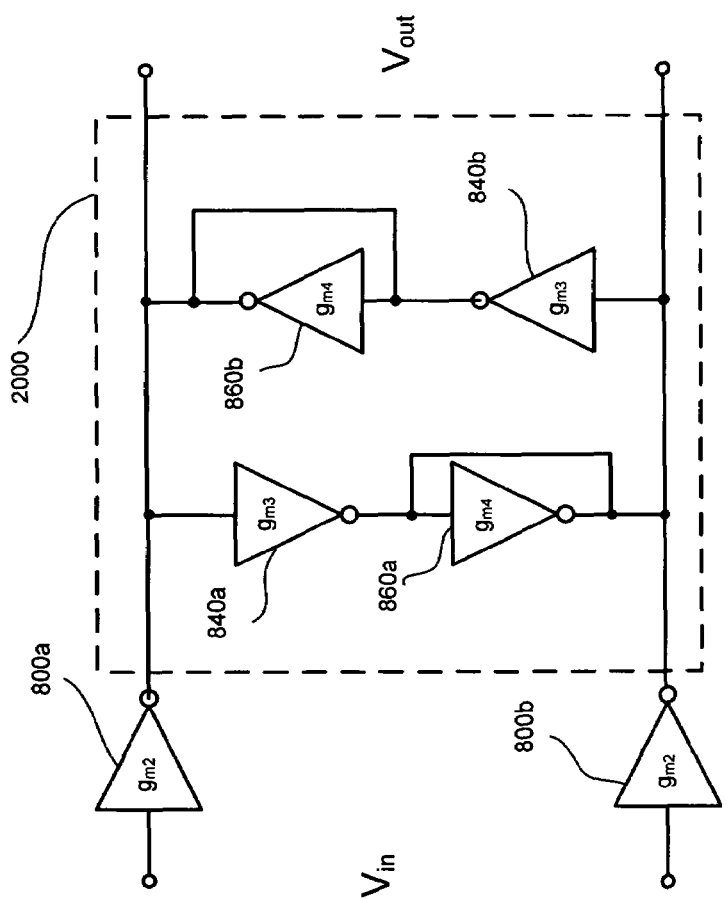
FIG. 11 illustrates a transconductance amplifier with differential inputs and outputs implemented as a Nauta transconductor as is known in the art.

Those of skill in the art will recognize that the foregoing embodiments of the filter topology of the invention can be implemented with any type of transconductor without exceeding the intended scope of the invention. In another embodiment, the topology of the invention may be implemented with a Nauta transconductor as illustrated in FIG. 11. The Nauta transconductor can be implemented with six inverter circuits 800a, 800b, 820a, 820b, 840a and 840b. The transconductance value of the Nauta transconductor is $g_m2$ as dictated by transconductor/inverters 800a and 800b. Transconductor/inverters 840a, 860a and 840b, 860b determine the common mode voltage and can provide control over the common mode of the transconductor. Typically, a Nauta transconductor is configured with all of the transconductances approximately equal to one another (i.e. $g_m2=g_m3=g_m4$). However, if $g_m3$ is made unequal to $g_m4$, a differential resistance can be generated that can be used to implement the resistors $R_a$, $R_b$ and $R_c$ of FIG. 6 without the need for either a physical resistor or even as implemented by a physical transconductor as in FIGS. 10A and 10B.

For the Nauta transconductor of FIG. 7, the differential output resistance $R_{out,diff}$ is given by $$R_{out,diff} = \frac{2}{g_{m4} - g_{m3}},$$

and the common mode resistance $R_{out,cm}$ is given by $$R_{out,cm} = \frac{2}{g_{m4} + g_{m3}}.$$

Thus, only the transconductance values of the Nauta transconductors need be altered to control the differential resistance value, which is also one of the benefits achieved by the implementation of the resistor as a transconductor as illustrated in of FIGS. 10A and 10B. Implementation of the resistors as the differential resistance of a Nauta transconductor, however, provides the additional benefit of eliminating the additional transconductors required to implement the resistor as a transconductance as shown in FIGS. 10A and 10B.

Figure 12:
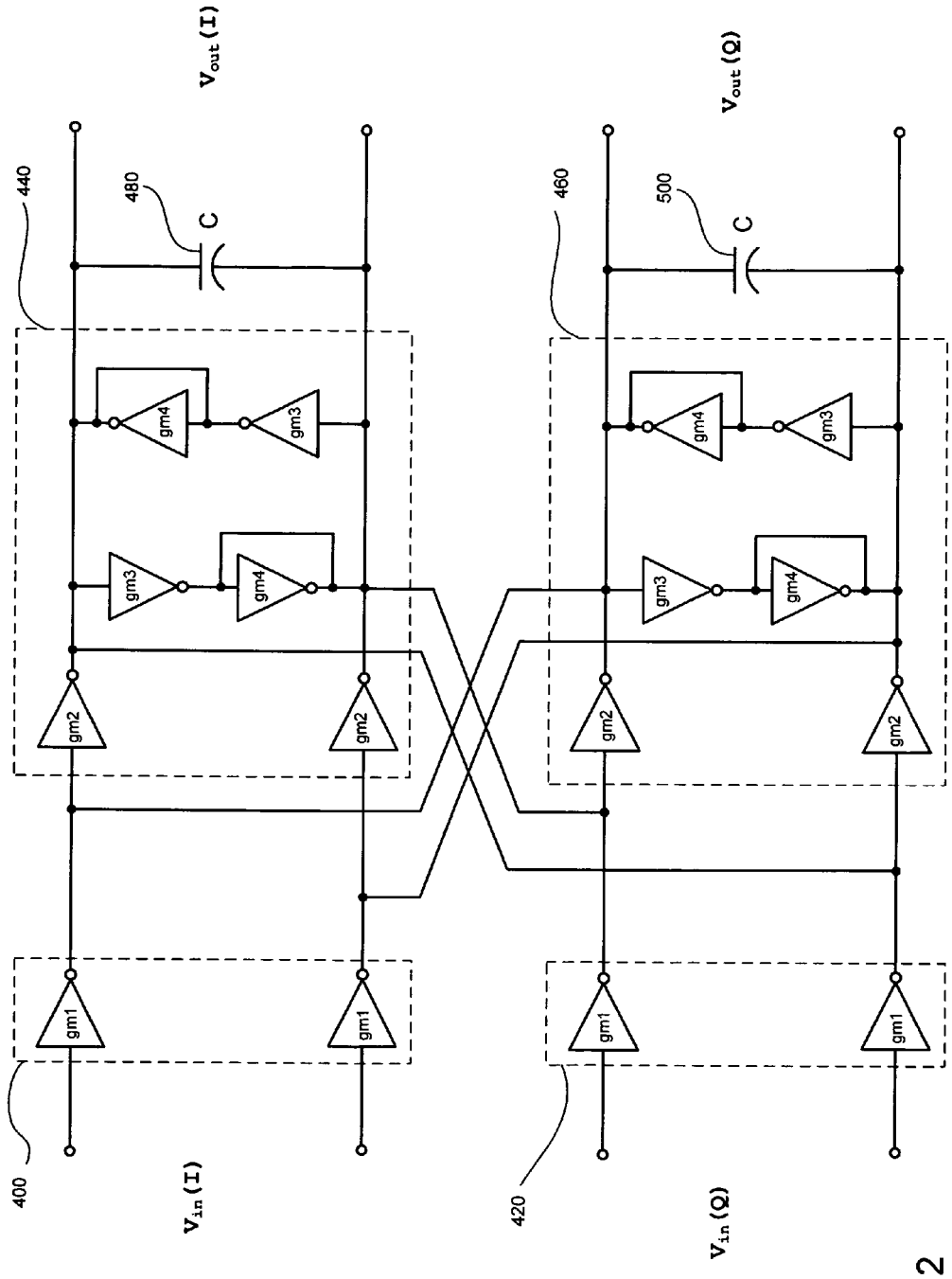
FIG. 12 illustrates one embodiment of the single-stage complex filter of FIG. 7A having differential inputs and outputs where the transconductance amplifiers are implemented as Nauta transconductors in accordance with the present invention.

FIG. 12 illustrates the implementation of a single-stage polyphase band-pass filter topology of the invention using a Nauta transconductor. One important feature of this implementation is that the common mode stage 2000 of the Nauta transconductor of FIG. 7 is not required for the first transconductors 400, 420 of the general topology. This is because the common mode output of transconductors 440, 460 are fed back to the outputs of transconductors 400, 420 respectively as a result of the gyrator topology of the stage. The fact that the inverters of the common mode stage are not required reduces the footprint of the topology even further. If the output conductance of the inverters is not taken into account, the pole locations of each stage will be given by the following equation:

$$p_{1,2} = -\frac{g_{m4} - g_{m3}}{2C} \pm j\frac{g_{m2}}{2C}.$$

The inverters of the Nauta transconductor can be implemented similarly to the inverter 282 of FIG. 5 as previously discussed. The transconductance for each inverter can be fixed by the size (i.e. W/L) of the transistors 298, 300 and the magnitude of the supply voltage VDD. Thus, the values of the transconductance can be established by sizing the transistors for a given supply voltage, and the actual supply voltage seen by the inverter can then be controlled using control or tuning voltage $V_C$ 290 and op amp 292. Transistor 296 can be used to adjust the voltage in response to the control voltage $V_C$ 290. Those of average skill in the art will recognize that there are numerous ways in which the supply voltage can be regulated for the inverters, without exceeding the scope of the invention.

In one embodiment, all of the Nauta transconductors 94 for a filter can be coupled to the same op amp 292 and control voltage 290. The control or tuning voltage can be supplied by the PLL of FIG. 6 as previously described. By controlling the supply voltage through transistor 296, the transconductance values can be adjusted to maintain the pole locations of the filter. In one embodiment, transistor 296 can be implemented as a native device to the process in which the filter circuit is manufactured. This provides the added benefit of not requiring any doping, so no threshold voltage is required to turn the device on. Those of average skill in the art will recognize that there may be other ways known to produce a control or tuning voltage to maintain the poles of the filter in the desired locations, and the invention is not intended to be limited by the example provided herein.

Moreover, those of average skill will recognize that the topology as disclosed herein may find applicability to filters and the application of those filters in addition to the channel select filter example as used in radio transceivers provided herein. The invention disclosed herein is susceptible to various modifications and alternative forms. Specific embodiments therefore have been shown by way of example in the drawings and detailed description. It should be understood, however, that the drawings and detailed description thereto are not intended to limit the invention to the particular form disclosed, but on the contrary, the invention is to cover all modifications, equivalents and alternatives falling within the spirit and scope of the present invention as defined by the claims.

What is claimed is:

1. A channel select filter of a Radio Frequency (RF) receiver of a wireless device, said channel select filter comprising:
    n filter stages connected in cascade, each of the n stages comprising:
    an in-phase signal path gain stage of an in-phase signal path operable to produce an in-phase amplified signal;
    a quadrature-phase signal path gain stage of a quadrature signal path operable to produce an quadrature-phase amplified signal;
    an in-phase signal path gyrator configured gain stage operable to produce an in-phase amplified and filtered output based upon the in-phase amplified signal and based upon a quadrature-phase amplified and filtered output;
    a quadrature-phase signal path gyrator configured gain stage operable to produce the quadrature-phase and filtered output based upon the quadrature-phase amplified signal and based upon the in-phase amplified and filtered output; and
    wherein each of the in-phase and quadrature-phase signal paths further includes a first impedance coupled to a first output of the corresponding gyrator, the first impedance comprising a resistance in parallel with a capacitance.

2. The channel select filter of claim 1 wherein the in-phase and quadrature phase signal path gain stages each include at least one transconductor having a first transconductance value.

3. The channel select filter of claim 2 where the at least one transconductor of each of the in-phase and quadrature-phase gain stages includes a supply current that is operably controlled to provide a specified amount of supply current necessary to maintain a ratio of a specified transconductance to a specified capacitance of the channel select filter.

4. The channel select filter of claim 3 wherein the first impedance of the in-phase and quadrature phase signal paths is a transconductor having a third transconductance value and further wherein the transconductor includes a common mode feedback loop.

5. The channel select filter of claim 2 where the at least one transconductor of the first impedance of each of the in-phase and quadrature-phase signal paths includes a supply current that is operably controlled to provide a specified amount of supply current necessary to maintain a ratio of a specified transconductance to a specified capacitance of the channel select filter.

6. The channel select filter of claim 5 wherein at least one transconductor is a Nauta transconductor that shares a common mode stage with a Nauta transconductor of the gyrator gain stage.

7. The channel select filter of claim 1 wherein the in-phase and quadrature phase signal path gyrator configured gain stages each include at least transconductor having a second transconductance value.

8. The channel select filter of claim 7 where the at least one transconductor of each of the in-phase and quadrature-phase gyrator configured gain stages includes a supply current that is operably controlled to provide a specified amount of supply current necessary to maintain a ratio of a specified transconductance to a specified capacitance of the channel select filter.

9. A complex $g_m/C$ filter having n stages, comprising:
for each of the n stages:
a gain stage for buffering a first and second stage input, the gain stage comprising at least two transconductors having a first transconductance ($g_{m1}$); and
a gyrator operable to establish at least one pole of the transfer characteristic of the gyrator, the gyrator comprising at least two transconductors having a second transconductance ($g_{m2}$), the gyrator further comprising a first and second input coupled to a first and second output of the gain stage, and a first and second stage output coupled to a first ($Z_1$) and a second ($Z_2$) impedance respectively, wherein $Z_1$ and $Z_2$ comprise a capacitance (C).

10. The filter of claim 9 wherein the gyrator is further operable to adjust one or more of $gm_2$, $Z_1$, and $Z_2$ of one or more of the stages of the filter to substantially match the filter transfer characteristic with a predetermined characteristic, wherein the adjustments for each of the one or more stages does not affect the at least one pole of the other stages.

11. The filter of claim 10 wherein the filter is further operable to maintain established poles by controlling a ratio of $g_{m2}/C$.

12. The filter of claim 10 wherein $$Z_1 = Z_2 = \frac{R}{1 + sRC},$$

and wherein the transfer characteristic is $$\frac{g_{m1}g_{m2}Z_1Z_2}{1 + g_{m2}^2 + (Z_1Z_2)}.$$

13. The filter of claim 12 wherein each of the resistances R comprising $Z_1$, and $Z_2$ are implemented as at least one transconductor, each at least one transconductor having a third transconductance and common mode feedback.

14. The filter of claim 13 wherein the filter is further operable to maintain established poles by controlling a ratio of $g_{m2}/C$.

15. The filter of claim 14 further comprising a controllable supply current for at least two transconductors of the gain stage, at least two transconductors of the gyrator and at least one transconductor implementing the R of $Z_1$ and $Z_2$ to provide an amount of supply current necessary to maintain a predetermined value for $g_{m2}/C$.

16. The filter of claim 15 wherein the at least two transconductors of the gain stages and the at least two transconductors of the gyrator are Nauta transconductors each having a gain stage and a differential stage, and wherein the resistances R comprising $Z_1$ and $Z_2$ are each implemented as the differential resistance of the at least two Nauta transconductors of the gyrator respectively.

17. The filter of claim 16 wherein the Nauta transconductors of the gain stage comprise only a gain stage and share the common mode stage of the at least two transconductors of the gyrator.

18. The filter of claim 9 wherein the n stages are coupled in cascade, and wherein the first and second stage inputs of a first of the n stages are each coupled to a first and second input signal, the first and second input signals being 90 degrees out of phase.

19. The filter of claim 18 wherein the first and second stage inputs and the first and second stage outputs are single-ended.

20. The filter of claim 18 wherein the first and second stage inputs and the first and second stage outputs are differential.

21. A Radio Frequency (RF) receiver of a wireless device comprising an amplifier for amplifying a received RF signal comprising to or more channels, the amplifier coupled to a down-converter for converting the received RF signal to a down-converted IF or baseband frequency, the RF receiver further comprising:
a channel select filter for selecting one of the one or more channels of the RF signal, the channel select filter operable to receive the down-converted signal from the down-converter, the channel select filter further comprising:
n stages connected in cascade, each of the n stages comprising:
a first gain stage comprising a first transconductor, the first gain stage operable to provide a specified amount of amplification and further operable as an input buffer;
a second gain stage comprising a second transconductor configured as a gyrator, the second gain stage operably coupled to receive the output of the first gain stage; and
an impedance stage each coupled to at an output gyrator stage, the impedance stage comprising a resistive device having a resistance R coupled in parallel with a capacitive device having a capacitance C.

22. The RF receiver of claim 21 wherein a transfer function of the channel select filter is substantially equal to $$\frac{g_{m1}g_{m2}Z_1Z_2}{1+g_{m2}^2+(Z_1Z_2)},$$

wherein $g_{m1}$ is the first transconductance, $g_{m2}$ is the second transconductance, $Z_1$ is the first impedance and $Z_2$ is the second impedance; and wherein $$Z_1 = Z_2 = \frac{R}{1+sRC}.$$

23. The RF receiver of claim 21 wherein the resistance R of the impedance stage comprises a third transconductor having a third transconductance and common mode feedback.

24. The RF receiver of claim 23 further including a current supply for each of the second and third transconductors that is operable to provide an amount of current necessary to maintain a predetermined ratio value between the second transconductance and the capacitance C of the impedance stage at a predetermined value.

* * * * *